United States Patent
Byren

(10) Patent No.: US 10,273,595 B2
(45) Date of Patent: Apr. 30, 2019

(54) METHOD FOR TAILORING THE DOPANT PROFILE IN A LASER CRYSTAL USING ZONE PROCESSING

(71) Applicant: Raytheon Company, Waltham, MA (US)

(72) Inventor: Robert W. Byren, Manhattan Beach, CA (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 15/904,039

(22) Filed: Feb. 23, 2018

(65) Prior Publication Data

US 2018/0245236 A1     Aug. 30, 2018

Related U.S. Application Data

(60) Continuation of application No. 14/487,295, filed on Sep. 16, 2014, now Pat. No. 9,926,644, which is a (Continued)

(51) Int. Cl.
*C30B 1/08* (2006.01)
*C30B 13/20* (2006.01)
(Continued)

(52) U.S. Cl.
CPC .............. *C30B 13/20* (2013.01); *C30B 13/10* (2013.01); *C30B 13/24* (2013.01); *C30B 29/12* (2013.01);
(Continued)

(58) Field of Classification Search
CPC .... C30B 1/00; C30B 1/02; C30B 1/06; C30B 1/08; C30B 11/00; C30B 11/003;
(Continued)

(56) References Cited

U.S. PATENT DOCUMENTS 3,108,073 A * 10/1963 Smouse ................. C30B 13/12
117/37
3,671,330 A   6/1972 Hall
(Continued)

FOREIGN PATENT DOCUMENTS

JP    3915505PAJ A    8/1962
JP    H06271381 A    9/1994
(Continued)

OTHER PUBLICATIONS

M. Azrakantsyan, et al. publication entitled "Yb3+:YAG growth with controlled doping distribution using modified horizontal direct crystallization," Journal of Crystal Growth, vol. 329, pp. 39-43 (2011) (Year: 2011).*

(Continued)

*Primary Examiner* — Kenneth A Bratland, Jr.

(57) ABSTRACT

A lasing medium having a tailored dopant concentration and a method of fabrication thereof is disclosed. The lasing medium has a single crystal having a continuous body having a selected length, wherein the crystal comprises dopant distributed along the length of the body to define a dopant concentration profile. In one embodiment, the dopant concentration profile results in a uniform heating profile. A method of fabricating a laser crystal having a tailored dopant concentration profile includes arranging a plurality of polycrystalline segments together to form an ingot, the polycrystalline segments each having dopant distributed, providing a crystal seed at a first end of the ingot, and moving a heating element along the ingot starting from the first end to a second end of the ingot, the moving heating element creating a moving molten region within the ingot while passing therealong.

20 Claims, 4 Drawing Sheets

Related U.S. Application Data division of application No. 13/210,786, filed on Aug. 16, 2011, now abandoned.

(51) Int. Cl.

| | | |
|---|---|---|
| *C30B 13/24* | (2006.01) | |
| *C30B 13/10* | (2006.01) | |
| *H01S 3/06* | (2006.01) | |
| *C30B 29/12* | (2006.01) | |
| *C30B 29/28* | (2006.01) | |
| *H01S 3/16* | (2006.01) | |

(52) U.S. Cl.
CPC ............ *C30B 29/28* (2013.01); *H01S 3/0617* (2013.01); *H01S 3/1611* (2013.01); *H01S 3/1643* (2013.01)

(58) Field of Classification Search
CPC ....... C30B 11/006; C30B 13/00; C30B 13/04; C30B 13/08; C30B 13/10; C30B 13/16; C30B 13/20; C30B 13/24; C30B 13/28; C30B 29/00; C30B 29/10; C30B 29/12; C30B 29/22; C30B 29/28; H01S 3/0617; H01S 3/1611; H01S 3/1643
USPC ... 117/2–4, 7, 9–11, 53, 73, 78, 81–82, 937, 117/945
See application file for complete search history.

(56) References Cited

U.S. PATENT DOCUMENTS

| | | | |
|---|---|---|---|
| 4,040,890 A | 8/1977 | Burrus, Jr. et al. | |
| 4,186,046 A * | 1/1980 | DeLai | C30B 11/00 117/37 |
| 5,114,528 A | 5/1992 | Kou | |
| 5,211,802 A | 5/1993 | Kaneko et al. | |
| 5,321,711 A * | 6/1994 | Rapoport | H01S 3/07 372/20 |
| 5,499,598 A | 3/1996 | Oda | |
| 7,960,191 B2 | 6/2011 | Ikesue | |
| 2007/0012238 A1 | 1/2007 | Kretzer et al. | |
| 2008/0107582 A1 * | 5/2008 | Hong | C30B 15/305 423/263 |
| 2011/0140241 A1 * | 6/2011 | Kawazoe | C30B 15/04 257/607 |

FOREIGN PATENT DOCUMENTS

| | | |
|---|---|---|
| JP | 2001213698 A | 8/2001 |
| JP | 2005008427 A | 1/2005 |
| WO | 9405062 A1 | 3/1994 |
| WO | WO-2010021272 A1 * 2/2010 | ............ C30B 15/04 |
| WO | 2011125897 A1 | 10/2011 |

OTHER PUBLICATIONS

Decision to Refuse dated Aug. 2, 2016 in connection with Japanese Patent Application No. 2014-526220, 6 pages.
Notification of Transmittal of the International Search Report and the Written Opinion of the International Searching Authority dated Nov. 27, 2012 in connection with International Patent Application No. PCT/US2012/51189, 10 pages.
Azrakantsyan et al., "Yb3+:YAG growth with controlled doping distribution using modified horizontal direct crystallization", Journal of Crystal Growth, vol. 329, 2011, pp. 39-43.
Xu et al., "Comparison of Yb:YAG crystals grown by CZ and TGT method", Journal of Crystal Growth, vol. 257, 2003, pp. 297-300.
Kamimura et al., "Ceramic YAG composite with ND gradient structure for homogenous absorption of pump power", Conference on Lasers and Electro-Optics, Baltimore, Maryland, May 6, 2007, CThT6, 2 pages.
Sangla et al., "High-power laser with Nd:YAG single-crystal fiber grown by micropulling down technique", Proc. of SPIE, vol. 6871, 2008, 68710X-1-68710X-11.
Office Action dated Nov. 4, 2015 in connection with Japanese Patent Application No. 2014-526220, 7 pages.
Extended European Search Report dated Nov. 27, 2015 in connection with European Patent Application No. 12823996.9, 7 pages.

* cited by examiner

METHOD FOR TAILORING THE DOPANT PROFILE IN A LASER CRYSTAL USING ZONE PROCESSING

CROSS-REFERENCE TO RELATED APPLICATION

This application is a continuation of U.S. patent application Ser. No. 14/487,295 filed on Sep. 16, 2014, which is a divisional of U.S. patent application Ser. No. 13/210,786 filed on Aug. 16, 2011 and entitled "METHOD FOR TAILORING THE DOPANT PROFILE IN A LASER CRYSTAL USING ZONE PROCESSING." The prior applications are hereby incorporated by reference in their entirety.

BACKGROUND

The present disclosure relates to solid-state lasers. More specifically, the present disclosure relates to a laser crystal having a tailored dopant profile, the method of fabricating thereof, and a lasing medium fabricated from said laser crystals.

Solid-state lasers are currently being developed and used for a variety of military and industrial applications, including range finding, target designation/marking, illumination, three-dimensional imaging, vibration sensing, profilometry, cutting, drilling, welding, heat treating and other material processing, electro-optical and infrared countermeasures, and directed energy weapons. A solid-state laser typically includes a laser amplifier medium or lasing medium disposed within an optical resonant cavity. The the resonant cavity or resonator provides the feedback necessary to build oscillation of electromagnetic radiation within the laser. The bulk lasing medium is typically in the shape of a slab, rod, or disk. When pumped, the medium provides amplification by a process of stimulated emission. The provision of reflective surfaces or gratings at the ends of the lasing medium provides a resonator.

In a typical laser, an incoherent light source imparts energy to the lasing medium, which produces light in which the waves are in phase through particular electron transitions. Where the lasing medium is properly designed, this "coherent light" is emitted as a beam.

Commercial laser gain media typically comprise single crystals having substantially uniform dopant concentration, such as Nd:YAG (neodymium doped yttrium-aluminum-garnet). Developmental lasers are being designed with optical-quality poly-crystalline ceramic lasing media which offer size and cost advantages over conventional single-crystal media. Solid-state lasing media, doped with an active ion, often use one or more flash lamps or laser diodes to provide "pump light." The diode pump light excites the active ions in the doped crystalline or ceramic lasing medium to a higher energy state. This process is known as "absorption." A "pump cavity" typically contains a uniformly doped lasing medium, which may be a crystal or glass or polycrystalline ceramic element fabricated in the shape of a rod, slab, or disk, and other elements, such as a pump light reflector or relay optics. Pump light is coupled into the cavity, typically with one or more flash lamps or laser diodes, either from the side of the cavity (i.e., side pumping) or the end of the cavity (i.e., end pumping).

Efficient absorption, in which nearly all of the pump light is absorbed by the doped medium, is a primary goal of laser designers. One method of attaining efficient absorption is by using high-absorption (highly doped) laser materials. A ray of pump light going through a doped crystal onetime is known as a "pass." With most existing designs, a pump light ray makes only one or two passes through the doped crystal before escaping, necessitating the use of high-absorption materials to achieve efficient absorption. Absorption is governed by an exponential function. Thus, when such a crystal is side-pumped, non-uniform absorption and thus non-uniform gain often result, with the highest gain being near the edge of the lasing medium. The concentration of gain near the edge of the medium leads to problems with parasitic oscillation and amplified spontaneous emission (ASE), extraction, efficiency, and beam quality (mode control). This is particularly problematic with respect to rod shaped media.

Another approach to the goal of high efficiency absorption uses end pumping, in which pump light comes into a pump cavity along its longitudinal axis. End pumping requires high-brightness pump diodes and durable dichroic coatings, since the pumping and laser light extraction take place through the same optical surfaces (i.e. the ends of the rod) while requiring quite different reflectivity characteristics. In the case of quasi-four level (e.g., ytterbium doped yttrium aluminum garnet, Yb:YAG) or three-level systems (e.g., ruby) where the high threshold requires greater pumping rate, pump "bleaching" can occur, in which a large fraction of the active ions have been excited and correspondingly fewer ions are in the ground state available for pump light absorption, resulting in reduced absorption for both 'Side- and end-pumping geometries.

A laser crystal having a tailored concentration profile may be especially useful for laser applications which may use a high-aspect-ration slab geometry for the lasing medium. One special case of the slab geometry is the planar waveguide (PWG) which is advantageous for applications requiring high gain, high average power, and high efficiency. As is known in the art, the PWG has a planar geometry, which guides light only in the thin dimension of the slab. For an end-pumped laser, the dopant absorbs the pump energy along the length of the medium and releases it radiatively as photons and non-radiatively as heat. Thus, heat is a function of both the energy pumped into the laser material and the dopant level of the laser material. Accordingly, as the pump energy and/or the dopant concentration are increased, both laser emission and heat generation are increased. Uniform dopant concentration that is typically used in lasing media results in localized heating. This is because the pump energy is absorbed by the dopant and thus decreases as it travels through the lasing medium. Accordingly, the material near the pump light end receives the most energy and produces the most heat, resulting in localized heating. Heat effects may have a negative impact on the laser efficiency and beam quality of high-average-power solid state lasers, and thus composite structure materials such as bonded crystals and composite ceramics have been used to mitigate the heat effects.

To achieve constant heating throughout the lasing medium, a tailored longitudinal concentration profile (of active ion dopant) is needed. Lasing media with different concentrations along the length thereof have been used. For example, multiple single crystal segments each having a different concentration are bonded together to form a lasing medium with a stepped dopant concentration profile. However, these lasing media are bonded at interfaces that cross the laser beam axis, resulting in media that are more expensive to fabricate and prone to damage. Alternatively, there are lasing media having a concentration profile that is created by mixing ultra-fine powders of different concentrations along the laser axis of the body. The structure is then sintered to form a dense, optically clear ceramic. However, these media may not exhibit the same superior lasing performance as a pristine single crystal.

What is needed is a method and apparatus that addresses one or more of the deficiencies noted above in fabricating lasing media having a tailored dopant concentration profile.

SUMMARY

One embodiment of this disclosure provides a method of fabricating a single, contiguous laser crystal having a tailored dopant concentration profile. The method includes arranging a plurality of polycrystalline segments together to form an ingot. The polycrystalline segments each have dopant distributed therein. The method further includes providing a crystal seed at a first end of the ingot and moving a heating element along the ingot starting from the first end to a second end of the ingot. The moving heating element creates a moving molten region within the ingot while passing therealong.

Another embodiment provides a single crystal having a tailored dopant concentration profile, produced by a process that includes the steps of arranging a plurality of polycrystalline segments together to form an ingot. The polycrystalline segments each have dopant distributed therein. The steps also include providing a crystal seed at a first end of the ingot and moving a heating element along the ingot starting from the first end to a second end of the ingot. The moving heating element creates a moving molten region within the ingot while passing therealong.

Another embodiment provides a lasing medium that includes a single crystal having a continuous body having a selected length, wherein the crystal comprises dopant distributed along the length of the body to define a dopant concentration profile that results in a uniform heating profile. The lasing medium may be produced by machining the single crystal using processes known in the art such as core drilling, saw cutting, grinding, polishing, and coating to produce a final lasing medium with a desired shape and optical characteristics.

These and other features and characteristics of the present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the inventive concept. As used in the specification and in the claims, the singular form of "a", "an", and "the" include plural referents unless the context clearly dictates otherwise.

DETAILED DESCRIPTION

Lasing media can be fabricated to have a tailored dopant concentration profile. In some embodiments, the lasing media includes an elongated, single crystal having a continuous body having a selected length. The crystal may include dopant distributed along the length of the body and may have a dopant concentration profile in accordance with a target dopant concentration profile.

The lasing medium may be fabricated using float zone processing or zone melting. Float zone processing has been used in the semiconductor industry to purify crystals by melting a narrow region of the crystal. This molten zone is then moved along an ingot by moving a heating element along the longitudinal axis of the crystal. As the molten region moves through the ingot, this molten region melts impure solids and leaves behind a single crystal region of purer materials as it solidifies. As a result, the impurities concentrate in the melt, and are moved to one end of the ingot. The purifying process works on the principle that, since the segregation coefficient k, which is the ratio of an impurity in the solid phase to that in the liquid phase, is usually less than one, the impurity atoms will diffuse to the liquid region at the solid/liquid boundary. Thus, by passing a crystal boule through a thin section of furnace very slowly, such that only a small region of the boule is molten at any time, the impurities may be segregated at the end of the crystal.

Figure 1A:
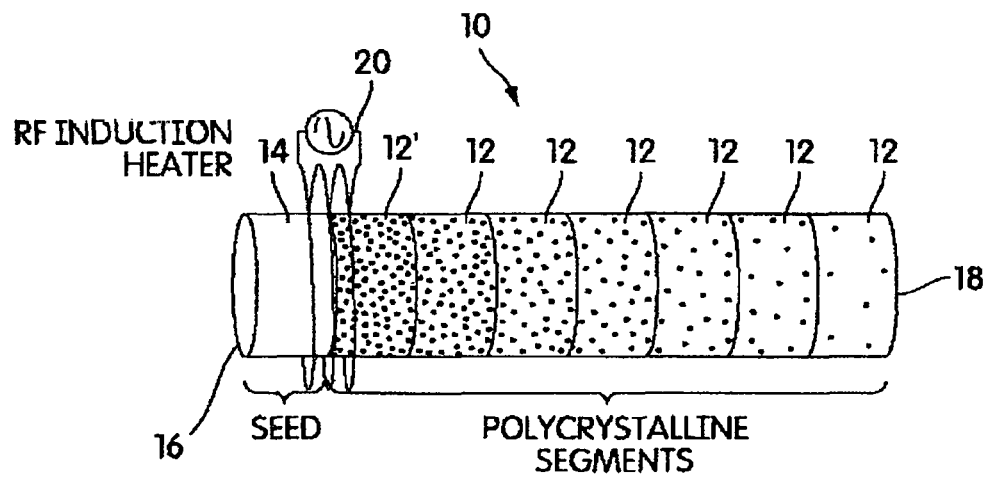
FIG. 1a illustrates a starting ingot formed from a plurality of polycrystalline segments.
Figure 1B:
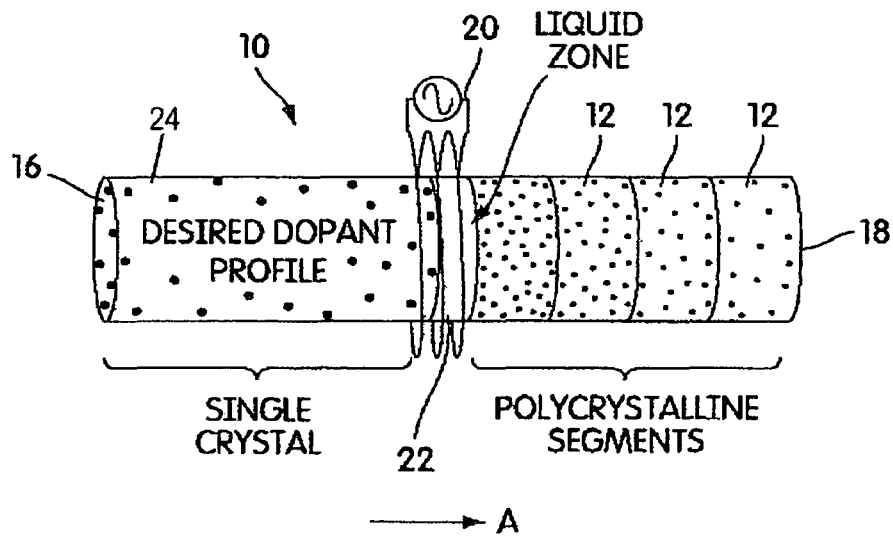
FIG. 1b illustrates a heating element passing through the ingot and creating a liquid zone therein during float zone processing.

FIGS. 1a-1b illustrates using float zone processing to tailor the concentration of active lasing species (or dopants) within a laser crystal. As known in the art, dopants are typically inserted into a substance in order to alter the electrical properties or the optical properties of the substance. In the case of crystalline substances, the atoms of the dopant commonly take the place of elements that were in the crystal lattice of the material. For example, YAG, which is also known as yttrium aluminum garnet ($Y_3Al_5O_{12}$), is a popular synthetic crystal material that is usually doped with some element to form a laser crystal. The yttrium ions in YAG can be replaced with laser-active rare earth ions (e.g., neodymium) up to some concentration limit without strongly affecting the lattice structure. The concentration limit is determined by size of the dopant ion (e.g., neodymium) relative to that of the substituted ion (e.g., yttrium). These dopant ions may essentially carry out the lasing process in the crystal. The other atoms in the crystal (i.e., the yttrium, aluminum, and oxygen atoms) support the dopant atoms and provide a crystal field that influences the energy band structure of the laser. A variety of crystal materials may be used, for example, $Y_3Al_5O_{12}$, $YLiF_4$, or $Gd_3Ga_5O_{12}$. A variety of dopants may also be used, just for example, ytterbium, erbium, thulium, or holmium.

As shown in FIG. 1a, starting ingot 10 is formed from plurality of poly crystalline segments 12. The starting ingot may be oriented such that its longitudinal axis is vertical. In one embodiment, each polycrystalline segment 12 has a different dopant concentration from the other segments. However, it is contemplated that segments 12 may have the same dopant concentration or alternatively may be a single polycrystalline segment. It should be appreciated that the number of segments 12 may vary in other embodiments. The length of each segment 12 and the concentration in each segment 12 may also vary to achieve the target concentration profile. Segments 12 may be vertically stacked without bonding or sintering and held in place only by gravity. Single seed crystal 14 may be provided at first end 16 of ingot 10 and arranged with segments 12 to form ingot 10. Seed crystal 10 may be substantially pure or doped with a concentration of dopant. Seed crystal 14 lattice orientation is the same as the desired orientation of the resulting lasing crystal. Ingot 10 may also include a second end 18 opposite first end 16. Heating element 20 may be used to form liquid zone 22. In one embodiment, ingot 10 is oriented such that its longitudinal axis is vertical with seed crystal at the top, the end of seed crystal not adjacent to a polycrystalline segment is clamped or bonded to a holding fixture to offset the force of gravity, and heating element 20 is moved vertically from top to bottom while ingot 10 is held stationary. The starting location of heating element 20 is near the interface between the seed crystal 14 and the adjacent polycrystalline segment 12' such that end 16 of seed crystal 14 remains a crystallized solid and defines the crystal structure and lattice orientation of the resulting lasing crystal. Heating element 20 may be provided by RF induction or any other methods or apparatuses. Just for example, in some embodiments, heating element 20 may be induction coils, ring-wound resistance heaters, or gas flames. In one embodiment, ingot 10 may be heated radiatively using an induction-heated tungsten ring. In some embodiments wherein ingot 10 is electrically conductive an electric current may be passed through the ingot while it is suspended in a magnetic field with the current controlled such that the material is magnetically levitated to minimize gravity sag in the liquid zone 22.

The liquid zone 22 formed by heating element 20 may similar to the "molten zone" described above with respect to purification of crystals. Liquid zone 22 moves through ingot 10 and disperses the dopants through ingot 10 to form the dopant concentration profile. FIG. 1b shows heating element 20 moving through ingot 10 in the direction of A, and thus moving liquid zone 22 through ingot 10. As heating element 20 moves liquid zone 22 through ingot 10, a resulting crystal portion 24 having the desired concentration profile is formed.

Seed crystal 14 and each segment 12 of ingot 10 may be doped with a selected active lasing species, which behaves as the "impurity" in the float zone purification process described above. However, rather than refining the ingot, the process of FIG. 1 produces a single crystal having a desired or target one-dimensional dopant profile. The resulting profile may be achieved by selecting the proper dopant concentration within each segment 12 such that the natural diffusion of active lasing species within the liquid zone and the difference in solubility of active lasing species between solid and liquid phases results in the desired profile. The difference in solubility of active lasing species between solid and liquid phases which gives rise to the lowering of concentration in the single crystal region is characterized by the segregation coefficient for the particular dopant within the particular crystal. In some embodiments, seed crystal 14 should be doped with the same concentration as desired at first end 16 of the resulting crystal and segments 12 near seed crystal 14 that will be melted first should have a higher concentration of dopant than the target concentration. In such embodiments, segments 12 closer to second end 18 of ingot 10 may have less concentration of dopant. Thus, in the embodiment shown in FIG. 1a, the concentrations of segments 12 are decreasing from first end 16 to second end 18. The smoothness of the doping profile may depend on the steepness of the desired concentration gradient and the number of poly crystalline segments 12 in ingot 10.

Figure 2:
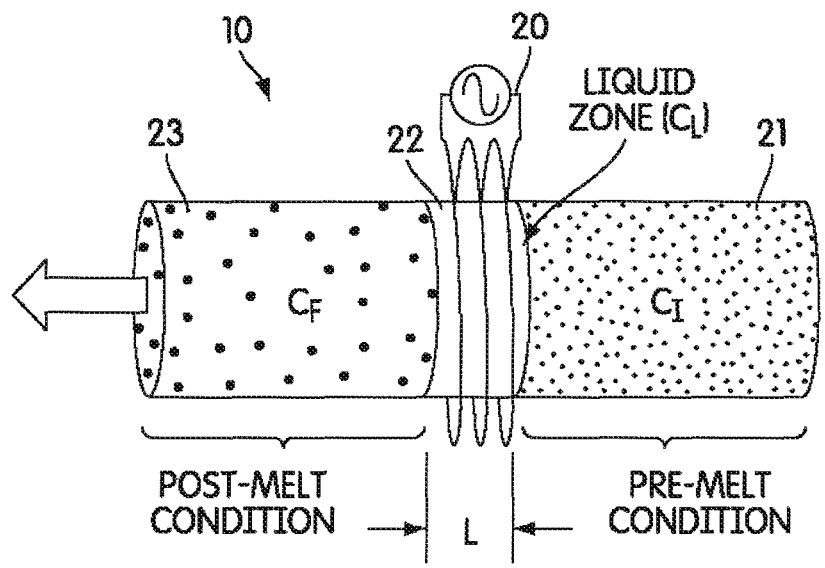
FIG. 2 illustrates a liquid zone and post-melt and pre-melt regions of the ingot during float zone processing.

FIG. 2 shows an expanded view of the region around liquid zone 22 where the dopant species are mixed within the liquid during melting. Region 21 represents a pre-melt region or condition and has a concentration of $C_I$. $C_I$ represents the initial concentration of dopant species by weight. $C_I$ can be a constant if a single uniformly-doped segment is used. Alternatively, if multiple segments 12 having different dopant concentrations are used, $C_I$ may be a function of distance along the length of ingot 10 in the direction of A. Region 23 represents the post-melt region or condition having a concentration of $C_F$. $C_F$ represents the final concentration, which is a function of distance along the length of the resulting crystal. It should be appreciated that multiple segments 12 may be used and their lengths and concentrations tailored to give a final concentration profile. For example, the final concentration of the resulting crystal may be tailored by varying the length of each polycrystalline segment, varying the concentration of the dopant in each polycrystalline segment, varying the length of the liquid zone, varying the number of passes that the heating element is moved along the ingot, and varying other factors that will be described below. Accordingly, $C_I$ represents the pre-melt condition and $C_F$ represents the post-melt condition.

Float zone processing that is performed on polycrystalline segments 12 can convert polycrystalline lasing material to a single crystal where a standard growth process (e.g., Czochralski growth process) is impossible, impractical from a size standpoint, and/or results in unwanted stress regions within the crystal. For example, neodymium-doped YAG formed by the Cazochralski growth process has a stressed region formed along the center of the crystal that is not useable for lasing media. In contrast, the resulting crystal formed by the float zone processing of multiple polycrystalline segments 12 has a continuous body, a tailored dopant concentration profile along the length of the body, and no substantially stressed regions. The resulting crystal may be a single crystal with the identical crystal structure and lattice orientation as crystal seed 14 and a concentration profile that can be arbitrarily tailored with precision by varying any of the factors or parameters described below.

Figure 3:
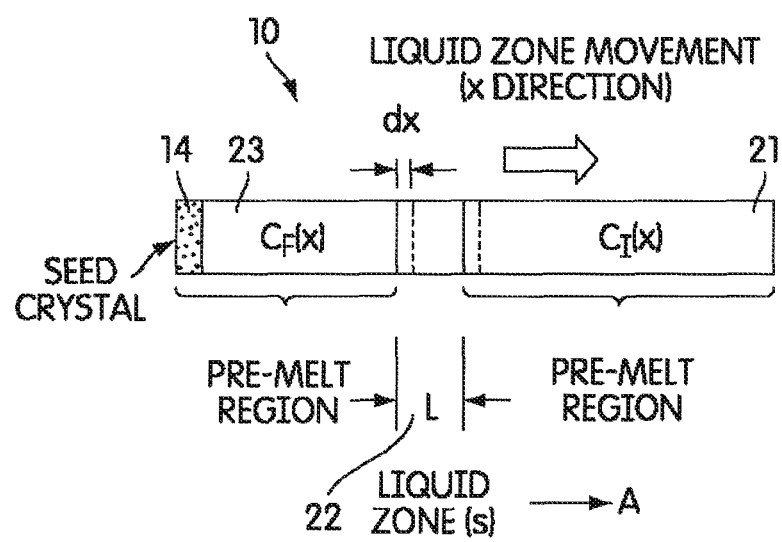
FIG. 3 schematically depicts the liquid zone and the post-melt and pre-melt regions of the ingot during float zone processing and identifies the parameters used in corresponding mathematical equations.

FIG. 3 shows the same region as FIG. 2 and shows the parameters used to analyze the doping profile. The parameters are defined as below:

L=length of liquid zone
x=distance along ingot
$C_I(x)$=concentration (by weight) of the starting ingot
$C_F(x)$=concentration (by weight) of final laser crystal
s=amount of dopant present in liquid zone at a given location
A=cross section area of ingot
k=segregation coefficient (ratio of dopant concentration in solid to that in liquid across solidus/liquidus interface)
ρ=specific gravity of solid crystal The molten region (liquid zone 22 shown in FIGS. 1a, 1b) propagates from left to right in the direction of A as heater 20 is moved accordingly. As liquid zone 22 advances by an infinitesimal distance, dx, the amount of dopant added to liquid zone 22 from the ingot is $C_I(x)A\rho dx$. The amount of dopant removed from liquid zone 22 at the retreating crystal interface is $(ks/L)dx$. Therefore, the net addition of dopant to liquid zone 22 when zone 22 advances by dx is $ds=[C_I(x) A\rho-(ks/L)]dx$.

The boundary condition at the seed crystal end is $s(0)=C_I(0)(AL\rho)$. The concentration of the final crystal boule is given by $C_F(X)=ks/(AL\rho)$. If the starting ingot has uniform doping ($C_I$=constant), then the differential equations can be solved explicitly, yielding an exponentially increasing value of $C_F(x)$ given by $C_F(x)=C_I[1-(1-k)\exp(-kxlL)]$.

The above equations can be solved for any given concentration profile for the polycrystalline ingot. That is, to tailor the concentration profile, the above equations may be used to determine the value of the parameters. Alternatively, the input values of the parameters may be used to determine the resulting concentration profile.

In one embodiment, the resulting lasing medium is neodymium-doped yttrium aluminum garnet (Nd:YAG). Nd:YAG offers substantial laser gain even for moderate excitation levels and pump intensities. The gain bandwidth may be relatively small, but this allows for a high gain efficiency and thus low threshold pump power. The segregation coefficient for neodymium in YAG (k=0.18) is very low due to the poor fit of the neodymium ion as a substitute impurity in the yttrium lattice site. This low value, however, produces a substantial concentration gradient in the float zone process, which may be desirable for certain end-pumping applications. The area of the ingot might not be a factor in the analysis, but the interfaces between the solid and the liquid phases should be relatively flat and normal to the direction of A. This may prevent or minimize a lateral component to the concentration gradient, which may not be desirable. However, the resulting crystal may have features or performance characteristics that vary based on the float zone processing apparatuses, the physical and thermal design of the laser pump head, and the handling and thermal robustness of laser crystal 12.

In one embodiment, the crystal may have the following parameters:
L=0.5 cm, 1 cm, 1.5 cm
$\rho$=4.56 g/cm$^3$
$C_I(0)$=1 atomic percent=1.36×10$^{20}$ Nd atoms/cm$^3$=2.98×10$^{19}$ Nd atoms/g
k=0.18

Figure 4:
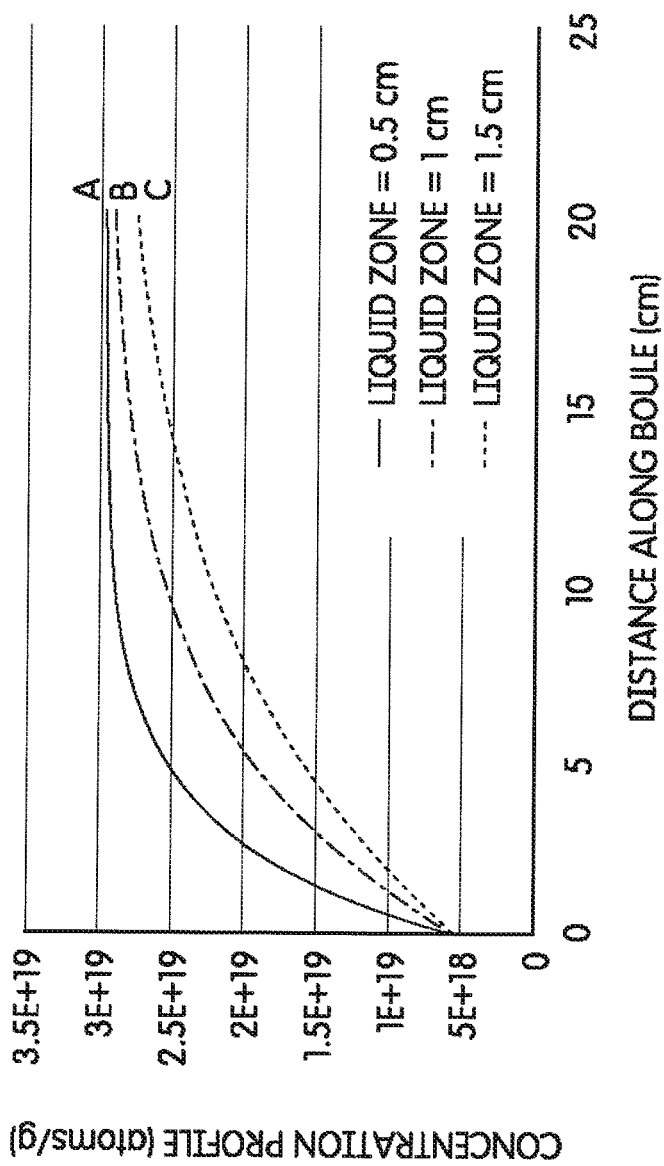
FIG. 4 is a plot of a final concentration profile for a laser crystal.

FIG. 4 plots the final concentration profile for a laser crystal with the above parameters. That is, FIG. 4 plots the final concentration profile for laser crystal 12 for several liquid zone lengths after a single pass of heating element 20 along the length of the starting ingot that was doped at 1 atomic percent neodymium. In particular, FIG. 4 shows the concentration profiles for crystals having liquid zone lengths of 0.5 cm, 1 cm, and 1.5 cm. Plot A shows the concentration profile for crystals having liquid zone length of 0.5 cm, plot B shows the concentration profile for crystals having liquid zone length of 1 cm, and plot C shows the concentration profile for crystals having liquid zone length of 1.5 cm. The mass density is 4.56 g/cm$^3$. The starting amount of neodymium dopant ($C_I(0)$) may be one atomic percent (1.36×10$^{20}$ Nd atoms/cm$^3$=2.98×1019 Nd atoms/g). The segregation coefficient of neodymium in YAG is 0.18.

Figure 5:
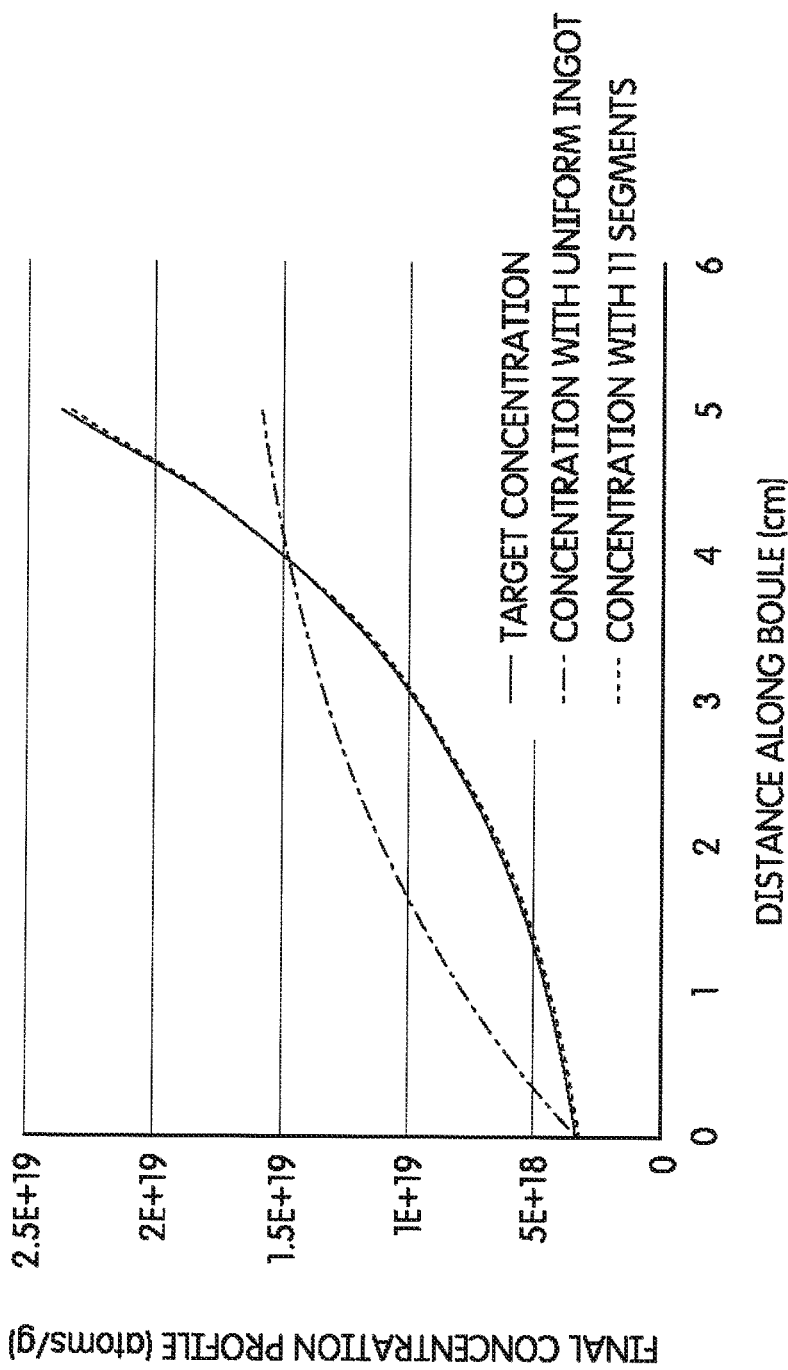
FIG. 5 is a plot of comparisons between a target concentration, a concentration profile resulting from float zone processing performed on a uniform ingot, and a concentration profile resulting from float zone processing performed on multiple segments having different dopant concentrations.

FIG. 5 shows a comparison of a resulting crystal having a final concentration produced by using multiple segments of different concentrations versus the resulting crystal having a final concentration produced by a simple float zone process with a uniformly doped starting ingot 10. The target concentration shown in this Figure represents a near-optimal concentration profile for a small 5 cm long laser crystal designed to be the active layer of a high aspect ratio PWG slab structure. The resultant concentration profile for the uniformly-doped ingot is also shown in FIG. 5, where the starting concentration of the ingot (1.95×10$^{19}$ atoms/g) is tailored to give the same final concentration as the target profile at the lean end (3.32×10$^{18}$ atoms/g). The resultant concentration for the segmented ingot is also shown where each segment is 0.5 cm long and has the following concentration:

Segment 1: 1.8×10$^{19}$ atoms/g
Segment 2: 6.0×10$^{18}$ atoms/g
Segment 3: 8.0×10$^{18}$ atoms/g
Segment 4: 9.5×10$^{18}$ atoms/g
Segment 5: 1.2×10$^{19}$ atoms/g
Segment 6: 1.6×10$^{19}$ atoms/g
Segment 7: 1.8×10$^{19}$ atoms/g
Segment 8: 2.3×10$^{19}$ atoms/g
Segment 9: 3.1×10$^{19}$ atoms/g
Segment 10: 3.7×10$^{19}$ atoms/g
Segment 11: 4.8×10$^{19}$ atoms/g In some embodiments, the extra segment at the end may be sacrificed to allow the float zone to pass through the entire useful region of the slab without discontinuity. As shown in FIG. 5, the concentration profile produced by float zone processing on multiple segments of different dopant concentrations as described above is closer to the target concentration than the concentration produced by a simple float zone process on a uniformly doped starting ingot 10. Accordingly, the dopant concentration profile of a single crystal may be tailored by performing float zone processing on a plurality of polycrystalline segments.

As mentioned above, uniformly doped lasing media may result in the material in the pump end receiving the most energy and producing the most heat, thus resulting in localized heating. However, the tailored dopant levels within the single crystal produced by the float zone processing described above may result in uniform heating and uniform laser emission throughout the crystal. That is, the tailored dopant profile of the single crystal may result in a strong, robust lasing medium having a uniform heating profile that can produce higher output power.

The above description has been provided for the purpose of illustration based on what are currently considered to be the most practical implementations, but it is to be understood that such detail is solely for that purpose, and that the inventive concept is not limited to the disclosed embodiments, but, on the contrary, is intended to cover modifications and equivalent arrangements that are encompassed by the appended claims. For example, it is to be understood that the present disclosure contemplates that, to the extent possible, one or more features of any embodiment can be combined with one or more features of any other embodiment.

Furthermore, since numerous modifications and changes will readily occur to those with skill in the art, it is not desired to limit the inventive concept to the exact construction and operation described herein. Those with skill in the art may discover other advantages of and applications for the inventive concept in the manufacture of solid-state lasers and other fields without departing from the spirit and scope of this invention.

What is claimed is:

1. A method comprising:
   determining a target dopant concentration profile of a laser crystal;

arranging multiple polycrystalline segments together in an order to form an ingot, each segment having dopant distributed therein, each segment having a different dopant concentration than other segments, the order based on decreasing dopant concentration such that the segment at a first end of the ingot has a higher dopant concentration and the segment at a second end of the ingot has a lower dopant concentration, the dopant selected based on a predetermined segregation coefficient of the dopant;

providing a seed crystal at the first end of the ingot; and moving a heating element along the ingot from the first end to the second end so as to create a single laser crystal having the target dopant concentration profile, the target dopant concentration profile changing smoothly and continuously from the first end to the second end, the moving heating element creating a moving molten region within the ingot while passing therealong, the heating element moved so as to create the moving molten region with a predetermined length, wherein the predetermined length and the predetermined segregation coefficient of the dopant are selected to result in the target dopant concentration profile.

2. The method of claim 1, wherein the dopant comprises neodymium, ytterbium, erbium, holmium, or a combination thereof.

3. The method of claim 1, wherein the heating element uses radio frequency (RF) induction.

4. The method of claim 1, wherein each of the segments has a different length.

5. The method of claim 1, wherein the seed crystal comprises a dopant concentration equal to a target concentration at the first end of the ingot.

6. The method of claim 1, wherein the single laser crystal represents a continuous body with a selected length, the continuous body having a common crystal structure and a common lattice orientation as the seed crystal.

7. The method of claim 1, wherein moving the heating element along the ingot comprises surrounding a portion of the ingot with the heating element.

8. The method of claim 1, wherein interfaces between the moving molten region and the segments of the ingot are substantially normal to an axis of the ingot.

9. The method of claim 1, wherein the laser crystal comprises $Y_3Al_5O_{12}$, $YLiF_4$, or $Gd_3Ga_5O_{12}$.

10. The method of claim 1, wherein the dopant concentration at the second end of the ingot is at least double the dopant concentration at the first end of the ingot.

11. The method of claim 1, wherein the target dopant concentration profile is represented by the following equation:

$$C_F(x) = C_1[1-(1-k)\exp(-kx/L)],$$

where
x=a distance along the ingot,
L=the length of the moving molten region,
$C_j(x)$=a concentration by weight of a starting ingot, and
k=a predetermined segregation coefficient of the dopant.

12. A method comprising:
determining a target dopant concentration profile of a laser crystal;
arranging multiple polycrystalline segments in an order to form an ingot, each segment having dopant distributed substantially uniformly therein, each segment having a different dopant concentration than other segments, the order based on decreasing dopant concentration such that the segment at a first end of the ingot has a higher dopant concentration and the segment at a second end of the ingot has a lower dopant concentration, the dopant selected based on a predetermined segregation coefficient of the dopant;

providing a seed crystal at the first end of the ingot; and moving a heating element along the ingot so as to create a single laser crystal having the target dopant concentration profile, the target dopant concentration profile changing smoothly and continuously from the first end to the second end, the moving heating element creating a moving molten region within the ingot while passing along the ingot, the heating element moved so as to create the moving molten region with a predetermined length, wherein the predetermined length and the predetermined segregation coefficient of the dopant are selected to result in the target dopant concentration profile.

13. The method of claim 12, wherein the dopant comprises neodymium, ytterbium, erbium, holmium, or a combination thereof.

14. The method of claim 12, wherein the heating element uses radio frequency (RF) induction.

15. The method of claim 12, wherein each of the segments has a different length.

16. The method of claim 12, wherein the seed crystal comprises a dopant concentration equal to a target concentration at the first end of the ingot.

17. The method of claim 12, wherein moving the heating element along the ingot comprises surrounding a portion of the ingot with the heating element.

18. The method of claim 12, wherein interfaces between the moving molten region and the segments are substantially normal to an axis of the ingot.

19. The method of claim 12, wherein the laser crystal comprises $Y_3Al_5O_{12}$, $YLiF_4$, or $Gd_3Ga_5O_{12}$.

20. A method comprising:
determining a target dopant concentration profile of a laser crystal;
obtaining an ingot comprising multiple polycrystalline segments arranged in an order, each segment having dopant distributed substantially uniformly therein, each segment having a different dopant concentration than other segments, the order based on decreasing dopant concentration such that the segment at a first end of the ingot has a higher dopant concentration and the segment at a second end of the ingot has a lower dopant concentration, the dopant selected based on a predetermined segregation coefficient of the dopant;

providing a seed crystal at the first end of the ingot; and moving a heating element along the ingot so as to create a single laser crystal having the target dopant concentration profile, the target dopant concentration profile changing smoothly and continuously from the first end to the second end, the moving heating element creating a moving molten region within the ingot while passing along the ingot, the heating element moved so as to create the moving molten region with a predetermined length, wherein the predetermined length and the predetermined segregation coefficient of the dopant are selected to result in the target dopant concentration profile, wherein a shape of the target dopant concentration profile does not substantially change at points along a length of the ingot associated with interfaces between the segments.

* * * * *